(12) United States Patent
Long et al.

(10) Patent No.: US 9,763,342 B2
(45) Date of Patent: Sep. 12, 2017

(54) CABLE RETENTION ASSEMBLY FOR A HEAD MOUNTED DISPLAY

(71) Applicant: Oculus VR, LLC, Menlo Park, CA (US)

(72) Inventors: Clare Regimbal Long, Edmonds, WA (US); Ryan Hamilton Brown, Palo Alto, CA (US); Matthew James Devoe, Menlo Park, CA (US); Rong Xu, Standford, CA (US)

(73) Assignee: Oculus VR, LLC, Menlo Park, CA (US)

( * ) Notice: Subject to any disclaimer, the term of this patent is extended or adjusted under 35 U.S.C. 154(b) by 8 days.

(21) Appl. No.: 14/964,439

(22) Filed: Dec. 9, 2015

(65) Prior Publication Data

US 2017/0171992 A1    Jun. 15, 2017

(51) Int. Cl.
*H05K 7/20* (2006.01)
*H05K 5/00* (2006.01)
*H01B 7/40* (2006.01)
*H01R 13/58* (2006.01)
*H01R 13/631* (2006.01)

(52) U.S. Cl.
CPC ............ *H05K 5/0026* (2013.01); *H01B 7/40* (2013.01); *H01R 13/58* (2013.01); *H01R 13/631* (2013.01); *H05K 5/0017* (2013.01)

(58) Field of Classification Search
CPC ....... H05K 5/0026; H05K 5/0017; H01B 7/40
USPC ......................................................... 361/728
See application file for complete search history.

(56) References Cited

U.S. PATENT DOCUMENTS

| 4,376,565 A * | 3/1983 | Bird ................... H01R 13/6456 439/681 |
| 4,678,121 A * | 7/1987 | Douty ................. H01R 12/728 439/607.47 |
| 7,794,263 B1 * | 9/2010 | Kim .................... H01R 13/6271 439/357 |
| 8,461,465 B2 * | 6/2013 | Golko .................. H01R 13/516 174/359 |
| 2006/0160399 A1 * | 7/2006 | Dawiedczyk ...... H01R 13/6275 439/374 |
| 2016/0260251 A1 * | 9/2016 | Stafford ............... G06T 19/003 |

* cited by examiner

*Primary Examiner* — Dion R Ferguson
*Assistant Examiner* — Mandeep S Buttar
(74) *Attorney, Agent, or Firm* — Perkins Coie LLP

(57) ABSTRACT

Cable retention assemblies for use with head mounted displays are disclosed herein. In various embodiments, a head mounted display has a front display module containing a circuit board operatively coupled to the displays and having a first connector. A connection cable with a second connector is releasably connected to the first connector. A cable retention assembly attached to the front display module adjacent to the first connector has a cable receptacle releasably engaging the second connector and retaining the second connector in a substantially fix position relative to the first connector to substantially isolate the first connector from axial or torsional loads applied to the cable.

18 Claims, 7 Drawing Sheets

CABLE RETENTION ASSEMBLY FOR A HEAD MOUNTED DISPLAY

TECHNICAL FIELD

This patent application is directed to head mounted displays and, more specifically, to head mounted displays connectable to data and/or power cables.

BACKGROUND

Head mounted displays are generally configured to be worn on a user's head with a front display module positioned over a portion of a user's face. Front display modules of the type used with virtual reality systems are typically coupled to an external control system via one or more data and/or power cables. There is a need for a versatile head mounted display with a cable retention assembly that retains the cable in connection with the front display module and provides strain relief to the cable during normal use of the head mounted display.

BRIEF DESCRIPTION OF THE DRAWINGS

Embodiments of a head mounted display ("HMD") with a front display module and cable retention assembly introduced herein may be better understood by referring to the following Detailed Description in conjunction with the accompanying drawings, in which like reference numerals indicate identical or functionally similar elements.

Figure 1:
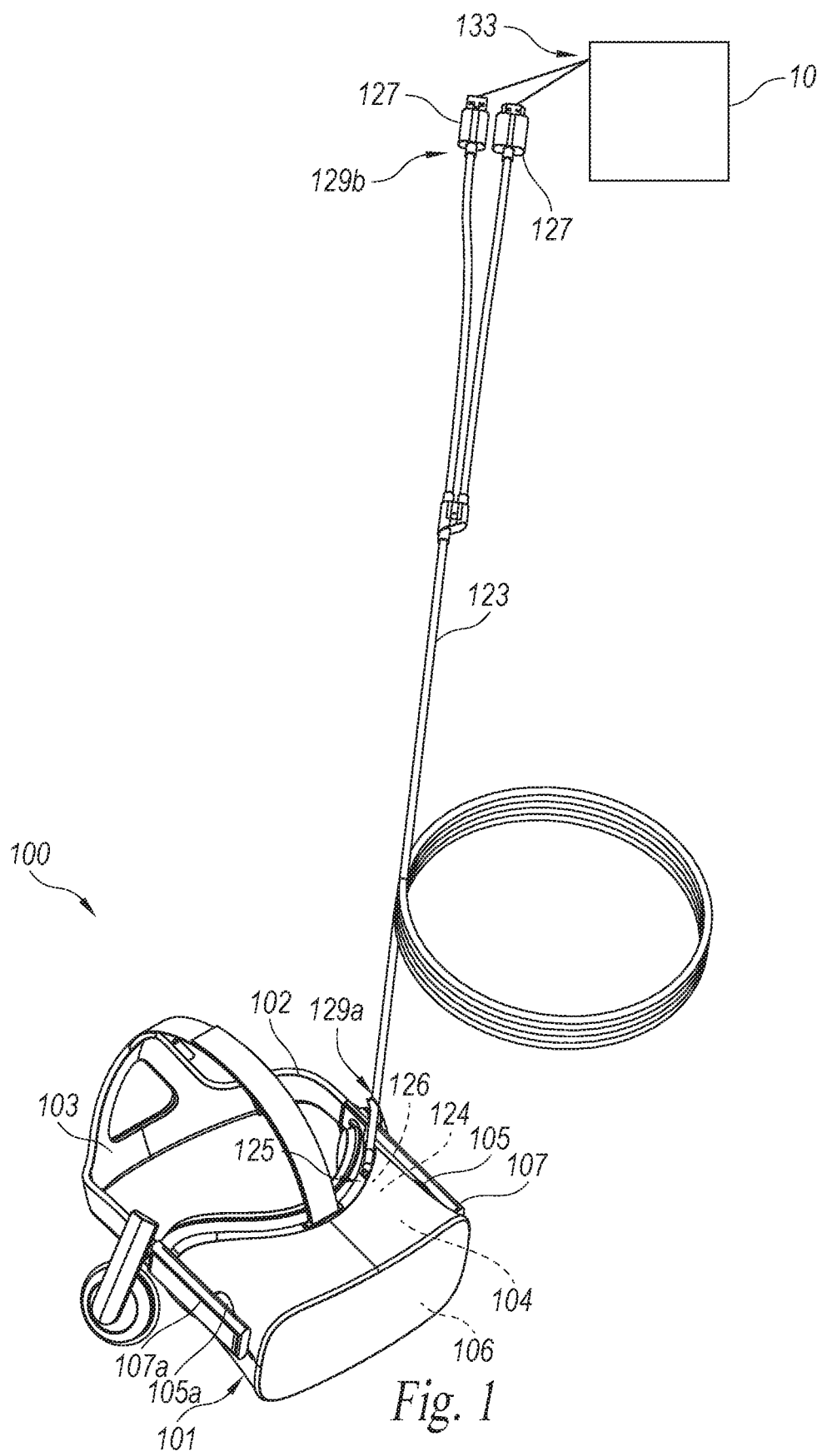
FIG. 1 is an isometric view of a HMD in accordance with an embodiment of the present technology.

The headings provided herein are for convenience only and do not necessarily affect the scope or meaning of the claimed embodiments. Further, the drawings have not necessarily been drawn to scale. For example, the dimensions of some of the elements in the figures may be expanded or reduced to help improve the understanding of the embodiments. Moreover, while the disclosed technology is amenable to various modifications and alternative forms, specific embodiments have been shown by way of example in the drawings and are described in detail below. The intention, however, is not to limit the embodiments described. On the contrary, the embodiments are intended to cover all modifications, equivalents, and alternatives falling within the scope of the embodiments.

DETAILED DESCRIPTION

Overview

A head mounted display ("HMD") with a front display module having a cable retention assembly is disclosed. The cable retention assembly removably secures the cable in position and provides strain relief to the cable. The cable retention assembly includes a receptacle sized and shaped to receive a connector on one end of the cable and a clip portion for removably securing the connector therein.

General Description

Various examples of the devices introduced above will now be described in further detail. The following description provides specific details for a thorough understanding and enabling description of these examples. One skilled in the relevant art will understand, however, that the techniques discussed herein may be practiced without many of these details. Likewise, one skilled in the relevant art will also understand that the technology can include many other features not described in detail herein. Additionally, some well-known structures or functions may not be shown or described in detail below so as to avoid unnecessarily obscuring the relevant description.

The terminology used below is to be interpreted in its broadest reasonable manner, even though it is being used in conjunction with a detailed description of some specific examples of the embodiments. Indeed, some terms may even be emphasized below; however, any terminology intended to be interpreted in any restricted manner will be overtly and specifically defined as such in this section.

FIG. 1 is an isometric view of a HMD 100 in accordance with an embodiment of the present technology. The HMD 100 is configured for use with a virtual reality (VR) system 10, such as the Rift™ available from Oculus™. The HMD 100 includes a front display module 101 and an adjustable strap assembly 103 operatively coupled to opposing lateral sides of the front display module 101 with joints 105. The strap assembly 103 includes one or more head straps 102 and a pair of substantially rigid connector arms 107 (identified individually as a first connector arm 107a and a second connector arm 107b) connected to the head straps 102 at opposing sides of the strap assembly 103. The stiff connector arms 107 attach at the joints 105 to adjustably couple the strap assembly 103 to the sides of the front display module 101 so as to securely and comfortably retain the front display module 101 adjacent the front of the user's face and over the user's eyes.

The front display module 101 has a housing 108 that contains optics 104 and one or more displays 106 operatively connected to a plurality of electronic components 120 that may be carried by one or more circuit boards 121. The displays 106 and associated electronic components 120 are operatively coupleable to the VR system 10 via a power and/or data communication cable 123. The housing 108 of the front display module 101 contains a cable retention assembly 125 positioned adjacent to a circuit board 121 that has a connector 124 releasably connectable to a mating connector 126 on a proximal end 129a of the cable 123 to interconnect the cable 123 to the electronic components 120. The distal end 129b of the cable 123 in the illustrated embodiment has one or more connectors 127 that connect to corresponding receiving connectors 133, such as ports or the like, on the VR system 10. In the illustrated embodiment, the connectors 126 and 127 on the cable 123 and the associated mating connectors 124 and 133, respectively, can include corresponding USB, USB-C, HDMI, and/or other suitable electronic interfaces for providing power and/or data between the front display module 101 and the VR system 10 via the cable 123.

Figure 2:
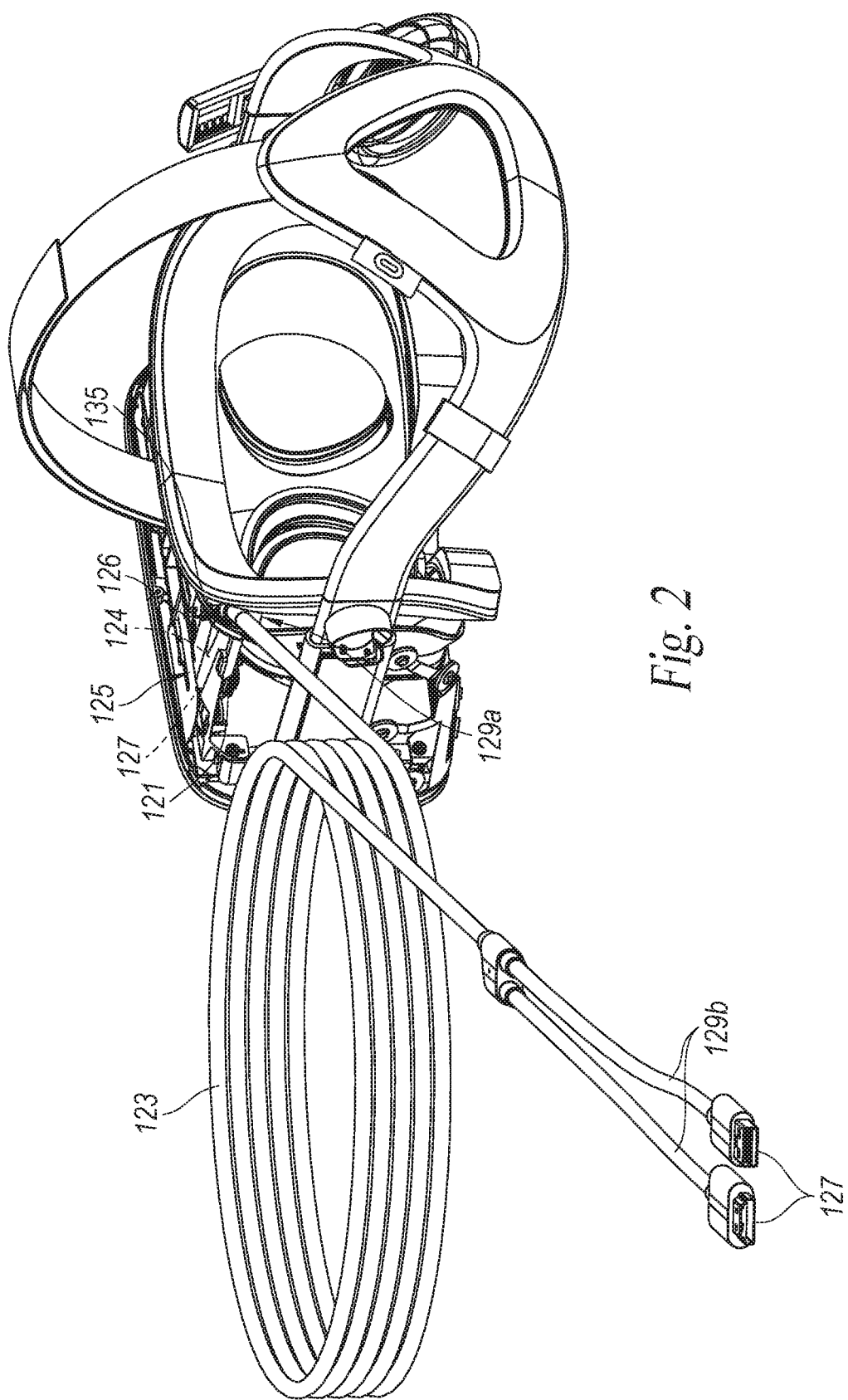
FIG. 2 is a rear isometric view of a portion of the HMD of FIG. 1 with portions of the strap assembly and front display module not shown for clarity.

FIG. 2 is an enlarged rear isometric view of a portion of the HMD 100 of FIG. 1. The illustrated HMD 100 has a contoured facial interface 135 (e.g., a foam interface) connected to the rear portion of the front display module 101 and shaped to contact a user's face when wearing the HMD 100. The circuit board 121 is supported on a top portion of the front display module's housing 108 forward of the facial interface 135. The cable retention assembly 125 is positioned over at least a portion of the circuit board 121 that includes the connector 124. In the illustrated embodiment, the cable 123 enters the upper left portion of the front display module 101 just forward of contoured facial interface 135, such that the cable's connector 126 operably mates with the circuit board's connector 124. The cable's connector 126 is carried and releasably held by the cable retention assembly 125 in a substantially fixed position relative to the circuit board's mating connector 124. As discussed in greater detail below, substantially all tensile and/or torsional loads applied to the cable 123 are reacted by the cable retention assembly 125 rather than by the mating interface between the connectors 124 and 126. This configuration substantially isolating the circuit board's connector 124 from axial or torsional loads applied to the cable 123, which substantially relieves the connectors from tensile or torsional strain during use of the HMD 100.

Figure 3:
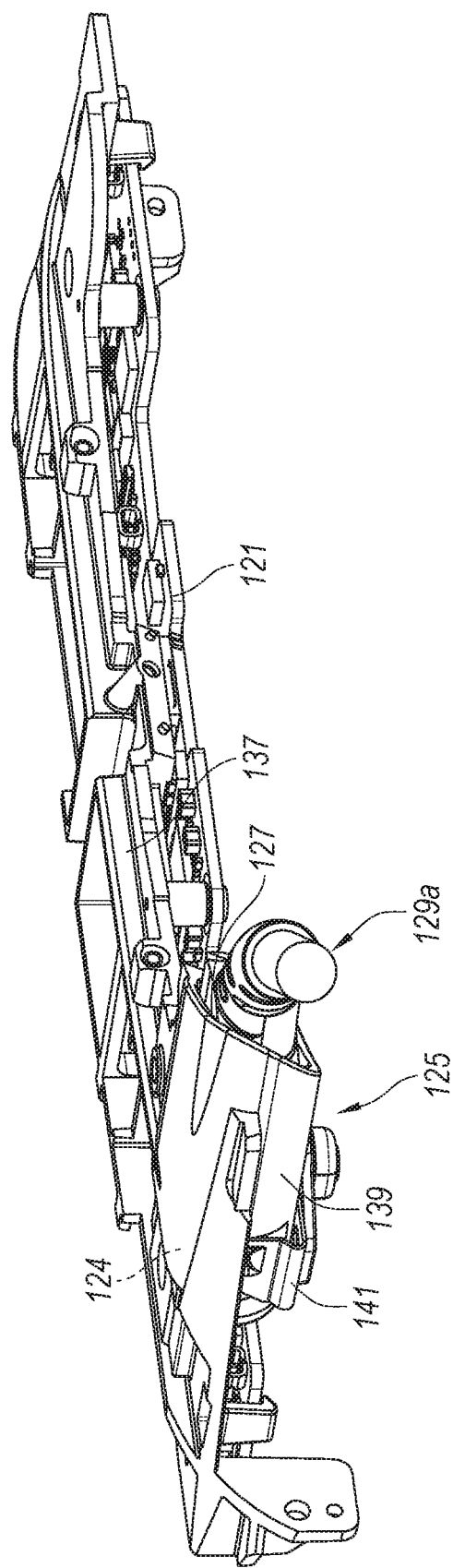
FIGS. 3 and 4 are rear isometric and exploded rear isometric views of the cable retention assembly and portions of the front display module of FIG. 2 configured in accordance with an embodiment of the present technology.
Figure 4:
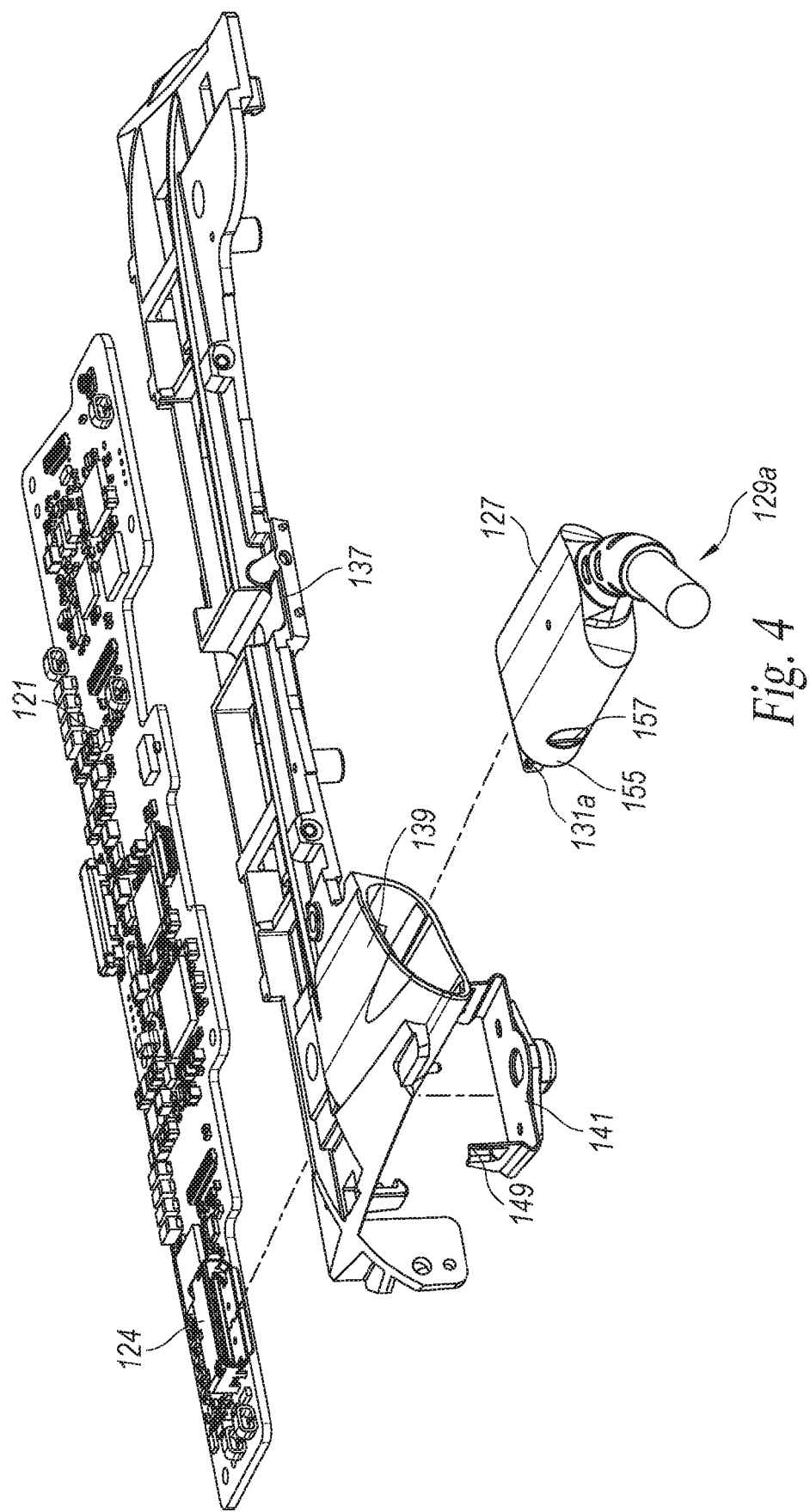

FIGS. 3 and 4 are rear isometric and rear exploded isometric views, respectively, of portions of the circuit board 121 and cable retention assembly 125 of FIG. 2. In the illustrated embodiments, the cable retention assembly 125 includes a main frame or body portion 137 positioned in the front display module 101 and atop at least a portion of the circuit board 121. The body portion 137 has a connector receptacle 139 positioned adjacent to the circuit board's connector 124. In the illustrated embodiment (from the perspective shown in the figures), the connector receptacle 139 is positioned on the left side of the body portion 137 generally between the circuit board's connector 124 and the facial interface 135 (FIG. 2). The connector receptacle 139 is sized, shaped, and positioned so that, when the cable's connector 127 is plugged into or otherwise operably engaged with the circuit board's mating connector 124, the cable's connector 127 is at least partially within and protected by the connector receptacle 139. The cable retention assembly 125 has a retaining clip 141 that releasably locks the cable's connector 127 within and to the connector receptacle 139 when the cable is in an installed position. The components of the cable retention assembly 125 (e.g., the body portion 137, receptacle 139, and connector 127) can be formed from an injection molding process (e.g., overmolding, insert molding, etc.) and/or made from a common material, such as plastic, composite, metal, or other suitable material. In other embodiments, the components of the cable retention assembly 125 can be made of different materials.

Figure 5:
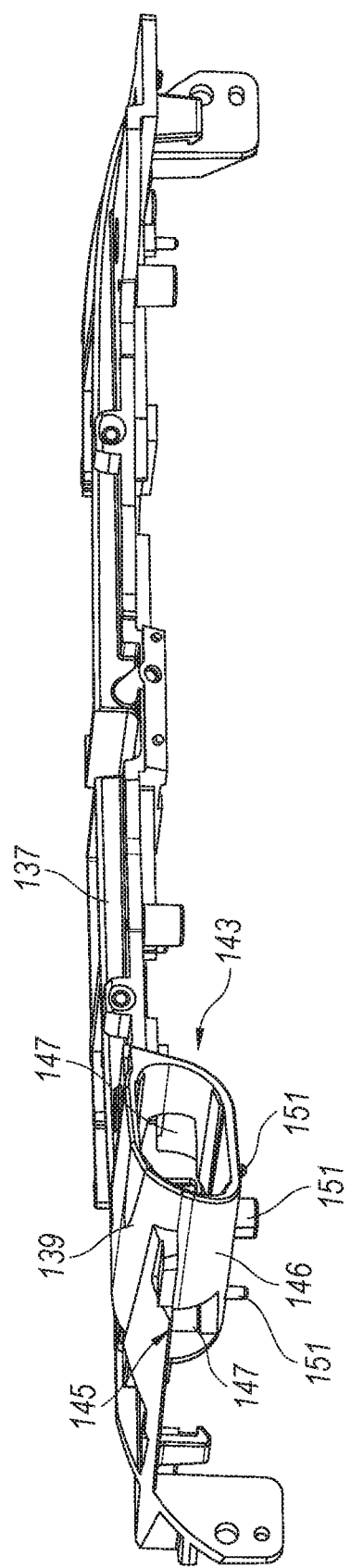
FIG. 5 is a rear isometric view of the receptacle of the cable retention assembly of FIGS. 3 and 4.

FIG. 5 is an isometric view of the body portion 137 and the connector receptacle 139 of the cable retention assembly 125 of FIGS. 3 and 4. The connector receptacle 139 of the illustrated embodiment includes opposing open ends 143 and 145. The connector receptacle 139 is configured to slidably receive the cable's connector 127 (FIG. 4) through the open distal end 143 until the connector's plug portion 131a extends through the open proximal end 145 far enough to mate with the circuit board's connector 124 (FIG. 4). The retaining clip 141 (FIG. 4) is attached to connector receptacle 139 in a position to releasably engage and retain the cable's connector 129 within the connector receptacle 139.

Figure 6:
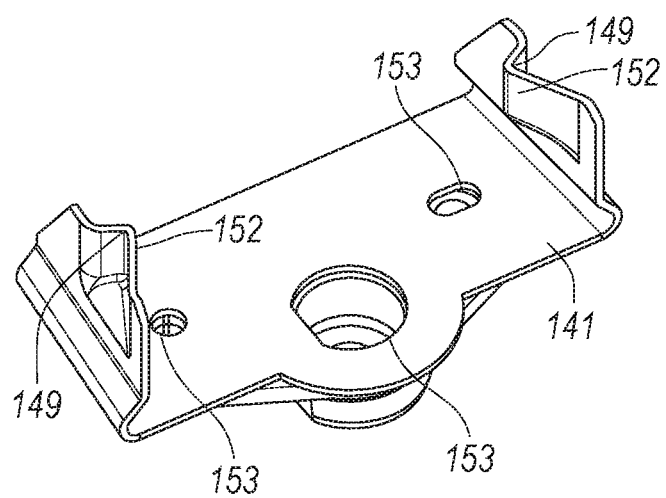
FIG. 6 is an enlarged rear isometric view of the retaining clip of the cable retention assembly of FIGS. 3 and 4.

In the illustrated embodiment, the connector receptacle 139 has lateral sidewalls 146 with openings 147 (e.g., cut-outs, windows) generally adjacent to the open proximal end 145. The receptacle 139 also has a plurality of retention and alignment pins 151 projecting away from a bottom wall 150 that extends between the lateral sidewalls 146. FIG. 6 is an isometric view of the retaining clip 141 separated from the connector receptacle 139 FIG. 5. The retaining clip 141 is attached to the receptacle 139 adjacent to the open proximal end 145. The retaining clip 141 has a pair of spaced apart, flexible engagement tabs 149 that extend at least partially through the openings 147 in the receptacle's sidewalls 146. The engagement tabs 149 are movable relative to the openings 147 between deflected and undeflected positions. The bottom of the retaining clip 141 also has a plurality of alignment apertures 153 that snugly receive the alignment pins 151 projecting from the bottom wall 150 of the receptacle 139 (FIG. 5). The mating arrangement between the retaining clip's alignment apertures 153 and the connector receptacle's alignment pins 151 (FIG. 6) is such that the bottom of the retaining clip 141 will not rotate, pivot, or otherwise move relative to the receptacle 139 and connector 127 therein (FIG. 4). The retaining clip 141 of the illustrated embodiment is a separate component attached to the receptacle 139, although the retaining clip 141 or portions of the retaining clip, such as the engagement tabs 149, can be integrally connected to the receptacle for releasably engaging the cable's connector 127.

The engagement tabs 149 of the illustrated embodiment have generally wedge-shaped locking members 152 projecting inwardly toward each other, such that when the retaining clip 141 is on the connector receptacle 139, the locking members 152 extend at least partially through the corresponding lateral side openings 147 when in the undeflected position. The engagement tabs 149 can be formed from metal, plastic or other elastically deformable or resilient material, such that the engagement tabs 149 are biased away from the deflected position toward the undeflected position. For example, the retention features 157 can be deflected laterally outwardly relative to the receptacle's sidewalls 146 by contact with a leading shoulder portion 155 of the cable's connector 127 (FIG. 4) as it passes through the receptacle 139 into the installed position engaging the circuit board's connector 124.

Figure 7:
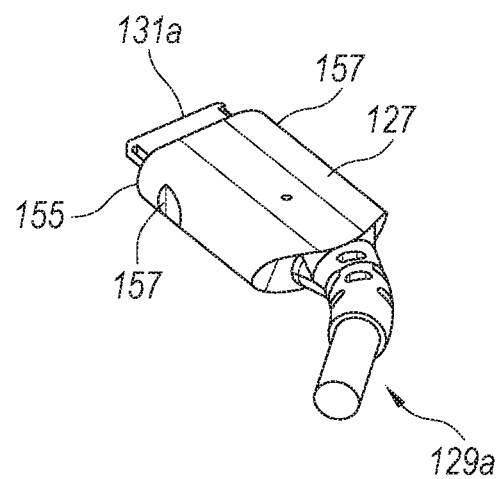
FIG. 7 is an enlarged rear isometric view of the connector of the cable retention assembly of FIGS. 3 and 4.

FIG. 7 is an isometric view of an embodiment of the cable's connector 127 of FIGS. 3 and 4. The connector 127 has retention features 157 (e.g., recesses) on lateral sides of the connector 127 and positioned rearward of the leading should portion 155. The retention features 157 are shaped and positioned to receive and retain the locking members 152 of the engagement tabs 149 of the retaining clip 141 when the connector 127 is in the installed position and the engagement tabs 149 return or "rebound" from the deflected position toward the initial undeflected position to secure the connector 127a within the receptacle 139 and in connection with the circuit board 121.

In the illustrated embodiment, the retention features 157 are corresponding wedge-shaped recesses on lateral sides of the connector 127. As the cable's connector 127 is slid axially into the receptacle 139, the leading shoulder portion 155 presses laterally against the wedge-shaped locking members 152 and move the engagement tabs 149 to the deflected position. When the retention features 157 are aligned with the locking members 152, the engagement tabs 149 automatically return toward the undeflected position with the locking members 152 positioned at least partially in the corresponding wedge-shaped recessed retention features 157. This substantially blocks or prevents the connector 127 from inadvertently being pulled out of the receptacle 139 in a direction away from the circuit board 121 or otherwise disconnected from the circuit board's connector 124. The connector 127 will remain locked in place within the receptacle 139 until the engagement tabs are manually moved to the deflected position wherein the locking members do not block the connector 127 from being slid axially out of the receptacle 139.

The connector receptacle 139 and the cable retention assembly 125 mounted atop the circuit board 121 (FIG. 4) in the illustrated embodiment is configured to react any axial loads that may be applied to the cable 123 during use of the HMD 100, such as if the cable is snagged or otherwise pulled relative to the front display mount. The receptacle 139 and the retaining clip 141 are also configured to snugly receive and engage the cable's connector 127 so as to react any torsional loads that may be applied to the connector 127 during use, such as due to gravitational forces, normal torsional loads experienced at the front display module during typical active use by the user, motion of the user's head, rotational positioning of the front display module by the user, etc. This configuration that reacts the loads applied to the cable acts to protect the mating connectors 124 and 127, as well as other components on the circuit board 121. The cable retention assembly 125, thus, removably secures the cable 123 to the front display module 101 and provides strain relief for the cable 123 and the connectors at the front mounted display 101.

Remarks

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

We claim:

1. A head mounted display for use with a virtual reality system, comprising:
   a front display module containing optics, one or more displays adjacent to the optics and coupleable to the virtual reality system, a circuit board operatively coupled to the display, and a first connector coupled to the circuit board;
   a strap assembly connected to the front display module and configurable to fit on a head of a user;
   a connection cable with a second connector releasably connected to the first connector; and
   a cable retention assembly attached to the front display module adjacent to the first connector, the cable retention assembly having a body portion and a retaining clip, the body portion being coupled to a portion of the circuit board, wherein the body portion has a cable receptacle being adjacent to the first connector and receiving the second connector therein for mating with the first connector, the retaining clip being releasably attached to the cable receptacle and releasably engaging the second connector and retaining the second connector in the cable receptacle in a substantially fix position relative to the body portion and the first connector to substantially isolate the first connector from axial or torsional loads applied to the cable; and wherein the retaining clip has deflectable engagement tabs and the second connector has recessed retention features that receive and retain the engagement tabs to hold the second connector in the receptable.

2. The head mounted display of claim 1 wherein the cable retention assembly is mounted to the front display module immediately adjacent to the circuit board.

3. The head mounted display of claim 1 wherein the retaining clip has deflectable retention features located on opposing lateral sides of the receptacle configured to engage and secure the second connector within the receptacle.

4. The head mounted display of claim 1, wherein the engagement tabs include substantially wedge-shaped locking members that directly engage the second connector.

5. The head mounted display of claim 1 wherein the retaining clip has deflectable engagement tabs and the second connector has a leading shoulder portion and recessed retention features rearward of the leading shoulder portion, wherein the leading shoulder portion is configured to deflect the engagement tabs when the second connector is installed into the cable receptacle.

6. The head mounted display of claim 1 wherein the retaining clip is attached to the cable receptacle with mounting pins, the retaining clip engaging the second connector, and the mounting pins react torsional loads applied to the second connector.

7. The head mounted display of claim 6 wherein the retaining clip has deflectable engagement tabs that releasably lock onto opposite sides of the second connector, wherein the engagement tabs are movable relative to the second connector between deflected and undeflected positions.

8. The head mounted display of claim 7 wherein the deflectable engagement tabs are biased toward the undeflected position.

9. The head mounted display of claim 1 wherein the connection cable is configured to carry power and data to the front display module.

10. The head mounted display of claim 1 wherein the front display module comprises a housing that contains the circuit board, the first connector, and the cable retention assembly.

11. The head mounted display of claim 1 wherein the second connector is insertable into the receptacle between a front end of the front display module and a facial interface for contacting a user's face when the head mounted display is worn by the user.

12. A head mounted display for use with a virtual reality system, comprising:
 a front display module containing optics, one or more displays coupleable to the virtual reality system, and at least one circuit board with a first connector coupled to the one or more displays and connectable to a second connector on a cable configured to interconnect the one or more displays to the virtual reality system; and
 a cable retention assembly attached to the front display module adjacent to the first connector and having a cable receptacle portion and a retaining clip releasably attached to the cable receptacle portion, the cable receptacle portion being adjacent to the first connector, the cable receptacle portion and the retaining clip being configured to removably retain the second connector when the second connector is mated with the first connector and to react axial and/or torsional loads applied to the cable to isolate the first connector and provide strain relief for the mating first and second connectors; and wherein the retaining clip has deflectable engagement tabs and the second connector has a leading shoulder portion and recessed retention features rearward of the leading shoulder portion, wherein the leading shoulder portion is configured to deflect the engagement tabs when the second connector is installed into the cable receptacle.

13. The head mounted display of claim 12, further comprising the cable with the second connector insertable through the cable receptacle portion.

14. The head mounted display of claim 12 wherein the retaining clip comprises retention features movable between first and second position, and being biased toward the first position, the cable receptacle portion and the retaining clip being configured to z releasably engage and retain the second connector in a substantially fixed position relative to the at least one circuit board when the retention features are in the first position.

15. The head mounted display of claim 13 wherein the cable retention assembly comprises a receptacle portion and the retaining clip is attached to the receptacle portion with mounting pins, the retaining clip engaging the second connector, and the mounting pins react torsional loads applied to the second connector.

16. A method of providing strain relief to a cable connecting a head mounted display with a virtual reality system, the method comprising:
 providing a front display module and a strap assembly, wherein the front display module contains optics, one or more circuit boards, and one or more displays coupleable to the virtual reality system, the display module being positionable adjacent to a user's face;
 coupling the front display module to the strap assembly;
 providing a cable retention assembly with a body portion having a cable receptacle adjacent to at least one of the circuit boards, the cable retention assembly having a retaining clip, having deflectable engagement tabs releasably attached to the cable receptacle and being positioned within the front display module; and
 securing a connector portion of a cable, having a recessed retention features that receive and retain the engagement tabs at least partially within the cable receptacle and to hold the connector portion of the cable in the cable receptacle with the retention clip to provide strain relief to the cable.

17. The method of claim 16 wherein securing a connector portion of a cable at least partially within the receptacle includes engaging corresponding retention features of the retention clip and the connector portion together.

18. The method of claim 16 wherein securing a connector portion of the cable at least partially within the receptacle includes passing the connector portion through at least a portion of the receptacle in a first substantially longitudinal direction toward a front end portion of the front display module and deflecting retention features of the retention clip from an undeflected position to a deflected position as the connector portion passes through the receptacle.

* * * * *